US008901001B2

(12) United States Patent
Chang et al.

(10) Patent No.: US 8,901,001 B2
(45) Date of Patent: Dec. 2, 2014

(54) SLURRY COMPOSITION AND METHOD OF FABRICATING DAMASCENE STRUCTURE USING THE SAME

(75) Inventors: Song-Yuan Chang, Chiayi County (TW); Wen-Tsai Tsai, Hsinchu County (TW); Ming-Hui Lu, Taipei (TW); Po-Yuan Shen, Taoyuan County (TW)

(73) Assignee: UWIZ Technology Co., Ltd., Taoyuan County (TW)

( * ) Notice: Subject to any disclaimer, the term of this patent is extended or adjusted under 35 U.S.C. 154(b) by 855 days.

(21) Appl. No.: 12/546,688

(22) Filed: Aug. 25, 2009

(65) Prior Publication Data

US 2010/0255681 A1 Oct. 7, 2010

(30) Foreign Application Priority Data

Apr. 2, 2009 (TW) ............................... 98111076 A

(51) Int. Cl.
 C09G 1/02 (2006.01)
 H01L 21/321 (2006.01)
 C09K 3/14 (2006.01)
 H01L 21/3105 (2006.01)

(52) U.S. Cl.
 CPC .............. *H01L 21/3212* (2013.01); *C09G 1/02* (2013.01); *C09K 3/1463* (2013.01); *H01L 21/31053* (2013.01)
 USPC ....................................................... 438/690

(58) Field of Classification Search
 USPC ............ 205/640; 210/681; 216/88; 252/79.1, 252/79.3; 424/401; 438/633, 645, 678, 689, 438/691, 692, 693; 451/41; 510/175; 524/425, 837; 525/454
 See application file for complete search history.

(56) References Cited

U.S. PATENT DOCUMENTS

| 5,700,383 | A | 12/1997 | Feller et al. |
| 6,093,649 | A * | 7/2000 | Roberts et al. ............... 438/691 |
| 6,316,365 | B1 | 11/2001 | Wang et al. |
| 6,530,824 | B2 | 3/2003 | Thomas et al. |
| 6,693,035 | B1 | 2/2004 | Sachan et al. |
| 6,719,920 | B2 | 4/2004 | Miller |
| 6,916,742 | B2 | 7/2005 | Ye et al. |
| 2002/0168923 | A1* | 11/2002 | Kaufman et al. ............... 451/36 |
| 2004/0067649 | A1* | 4/2004 | Hellring et al. ............... 438/689 |
| 2004/0127374 | A1* | 7/2004 | Jo et al. .......................... 510/175 |
| 2006/0006074 | A1* | 1/2006 | Liu et al. ....................... 205/640 |
| 2008/0003829 | A1 | 1/2008 | Shin et al. |

FOREIGN PATENT DOCUMENTS

| EP | 1522565 | 4/2005 |
| GB | 2344459 | 6/2000 |
| TW | 574352 | 2/2004 |

OTHER PUBLICATIONS

"Written Opinion and Search Report of Singapore Counterpart Application", issued on Aug. 23, 2010, p. 1-16.

* cited by examiner

*Primary Examiner* — Duy Deo
*Assistant Examiner* — Erin Bergner
(74) *Attorney, Agent, or Firm* — Jianq Chyun IP Office

(57) ABSTRACT

A slurry composition has an amount of 100% and includes abrasives, an acid-base pH adjustor, an oxidant and water. A content of the abrasives is 10 wt % to 40 wt %, and a polydisperse index of the abrasives sizes is greater than 1.8. A content of the acid-base pH adjustor is 0.01 wt % to 10 wt %. A content of the oxidant is 0.01 wt % to 10 wt %. A remaining portion of the slurry composition is water.

23 Claims, 2 Drawing Sheets

SLURRY COMPOSITION AND METHOD OF FABRICATING DAMASCENE STRUCTURE USING THE SAME

CROSS-REFERENCE TO RELATED APPLICATION

This application claims the priority benefit of Taiwan application serial no. 98111076, filed on Apr. 2, 2009. The entirety of the above-mentioned patent application is hereby incorporated by reference herein and made a part of this specification.

BACKGROUND OF THE INVENTION

1. Field of the Invention

The present invention relates to a composition and a semiconductor process using the composition, and particularly to a slurry composition and a method of fabricating a damascene structure using the slurry composition.

2. Description of Related Art

In processes of very large scale integrated circuit (VLSI), chemical mechanical polishing (CMP) processes provide overall global planarization of a surface of a wafer. Especially when semiconductor processes enter the field of sub-microns, CMP methods are an even more indispensable processing technology.

CMP methods are common in damascene processes, and are one of the most important key technologies in fabricating methods of a damascene structure. The CMP processes in the fabricating methods of the damascene structure include a step of removing a metal layer and a step of removing a barrier layer.

Recently, in order to enhance throughput of semiconductor devices, in the step of removing the barrier layer of the fabricating processes of the damascene structure, speeds of removing a film must be enhanced.

SUMMARY OF THE INVENTION

The present invention provides a slurry composition which quickly removes a film.

The present invention provides a fabricating method of a damascene structure which effectively enhances throughput of semiconductor devices.

The present invention provides a slurry composition which has a total amount of 100% and includes abrasives, an acid-base pH adjustor, an oxidant and water. A content of the abrasives is 10 wt % to 40 wt %, and the polydisperse index of abrasives size is greater than 1.8. A content of the acid-base pH adjustor is 0.01 wt % to 10 wt %. A content of the oxidant is 0.01 wt % to 10 wt %. A remaining portion of the slurry composition is water.

According to an embodiment of the present invention, in the above slurry composition, the content of the abrasives is, for example, 15 wt % to 35 wt %.

According to an embodiment of the present invention, in the above slurry composition, a material of the abrasives is, for example, a silicon dioxide, a metal oxide, a polymer material or hybrids of metal oxides and polymer materials.

According to an embodiment of the present invention, in the above slurry composition, the silicon dioxide is, for example, fumed silica or colloidal silica.

According to an embodiment of the present invention, in the above slurry composition, the metal oxide is, for example, alumina or titania.

According to an embodiment of the present invention, in the above slurry composition, the content of the acid-base pH adjustor is, for example, 0.1 wt % to 5 wt %.

According to an embodiment of the present invention, in the above slurry composition, the acid-base pH adjustor is, for example, an acid, a base or a combination thereof.

According to an embodiment of the present invention, in the above slurry composition, the acid is, for example, at least one of citric acid, oxalic acid, phosphoric acid, amino trimethyl phosphonic acid, 1-hydroxyethylidene-1,1-diphosphoric acid, 2-phosphonobutane-1,2,4-tricarboxylic acid, nitrilotrismethylenetriphosphonic acid, hexamethylene diamine tetra methylene phosphonic acid, diethylene triamine penta methylene phosphonic acid, hexamethylene triamine penta methylene phosphonic acid, malonic acid, lactic acid, acetic acid, propanic acid, butanoic acid, pentanoic acid, hexanoic acid, succinic acid, adipic acid, malic acid, maleic acid, tartaric acid, methane sulfonic acid, toluenesulfonic acid, dodecylbenzenesulfonic acid, ethylenediaminetetraacetic acid, diethylenetriaminepentaacetic acid, nitrilotriacetic acid, N-(hydroxyethyl)-ethylenediaminetriacetic acid and combinations thereof.

According to an embodiment of the present invention, in the above slurry composition, the base is, for example, an organic base or inorganic base.

According to an embodiment of the present invention, in the above slurry composition, the inorganic base is, for example, potassium hydroxide (KOH) or sodium hydroxide (NaOH).

According to an embodiment of the present invention, in the above slurry composition, the pH value of the slurry composition is, for example, pH 9 to 12.

According to an embodiment of the present invention, in the above slurry composition, the pH value of the slurry composition is, for example, pH 10.5 to 11.5.

According to an embodiment of the present invention, in the above slurry composition, the oxide is, for example, hydrogen peroxide ($H_2O_2$).

According to an embodiment of the present invention, in the above slurry composition, the water is, for example, deionized water.

According to an embodiment of the present invention, the above slurry composition further includes a complexing agent, wherein a content thereof ranges from 10 ppm to 500 ppm.

According to an embodiment of the present invention, in the above slurry composition, the content of the complexing agent is, for example, 70 ppm to 500 ppm.

According to an embodiment of the present invention, in the above slurry composition, the content of the complexing agent is, for example, 70 ppm to 300 ppm.

According to an embodiment of the present invention, in the above slurry composition, when using the slurry composition, a polishing selectivity ratio of a barrier material to a metal material is, for example, less than or equal to 1.2.

According to an embodiment of the present invention, in the above slurry composition, when using the slurry composition, the polishing selectivity ratio of the dielectric material to the metal material is, for example, less than 2.

According to an embodiment of the present invention, in the above slurry composition, the complexing agent is, for example, at least one of citric acid, oxalic acid, ammonium oxalate, tartaric acid, histidine, alanine and glycine.

According to an embodiment of the present invention, in the above slurry composition, a removal rate of the slurry composition to the dielectric material is, for example, 1000 angstroms/minute.

The present invention provides a method of fabricating a damascene structure, wherein the method includes the following steps. First, a substrate is provided, wherein a dielectric layer has been formed on the substrate, and the dielectric layer has an opening which exposes the substrate. Next, a barrier layer is conformally formed on the dielectric layer and the substrate. Then, a metal layer which fills the opening is formed on the barrier layer. Afterwards, a first chemical mechanical polishing (CMP) process is performed on the metal layer by using the barrier layer as a polishing stop layer. Then, by using the slurry composition as described above, a second CMP process is performed to remove the barrier layer outside the opening.

According to an embodiment of the present embodiment, in the above method of fabricating the damascene structure, the opening is, for example, a single damascene opening or a dual damascene opening.

According to an embodiment of the present embodiment, in the above method of fabricating the damascene structure, the single damascene opening is, for example, a contact opening, a via opening or a trench.

According to an embodiment of the present embodiment, in the above method of fabricating the damascene structure, the dual damascene opening is, for example, formed by the contact opening and the trench or by the via opening and the trench.

According to an embodiment of the present invention, in the above method of fabricating the damascene structure, a material of the dielectric layer is, for example, a silicon oxide.

According to an embodiment of the present invention, in the above method of fabricating the damascene structure, the silicon oxide is, for example, tetraethosiloxane (TEOS) silicon oxide.

According to an embodiment of the present invention, in the above method of fabricating the damascene structure, a material of the barrier layer is, for example, tantalum (Ta), tantalum nitride (TaN), tantalum/tantalum nitride (Ta/TaN), titanium (Ti), titanium nitride (TiN) or titanium/titanium nitride (Ti/TiN).

According to an embodiment of the present invention, in the above method of fabricating the damascene structure, a material of the metal layer is, for example, copper or tungsten.

Due to the above, in the slurry composition provided by the present invention, since the polydisperse index of the abrasives sizes is greater than 1.8, the speed of removing the film is enhanced.

In addition, when the slurry composition provided by the present invention includes the complexing agent, the speed of removing the film is further enhanced. When the slurry composition includes the complexing agent, the polishing selectivity ratio of the barrier material to the metal material and the polishing selectivity ratio of the dielectric material to the metal material are lowered.

On the other hand, in the method of fabricating the damascene structure provided by the present invention, since the slurry composition described above is used to performed the second CMP process, a part of the barrier layer, a part of the dielectric layer and a part of the metal layer are quickly removed, thereby increasing yield of the semiconductor devices.

In order to make the aforementioned and other features and advantages of the present invention more comprehensible, several embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1A:
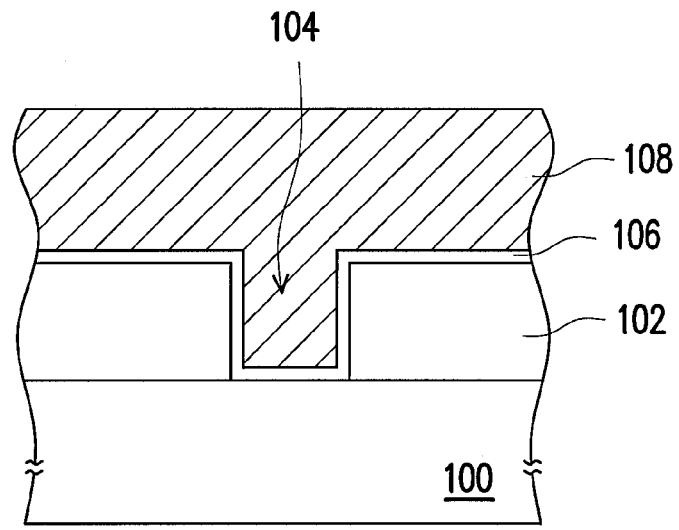
FIGS. 1A through 1C are schematic cross-sectional views showing steps of fabricating a damascene structure according to an embodiment of the present invention.

First, a slurry composition of the present invention is described. The slurry composition is adapted to be used in a CMP processes.

A slurry composition according to an embodiment of the present invention has a total amount of 100% and includes abrasives, an acid-base pH adjustor, an oxidant and water.

A polydisperse index of abrasives sizes is greater than 1.8, so that a speed of the slurry composition removing a film is effectively enhanced. For example, a removal rate of the slurry composition to a dielectric material is enhanced to greater than 1000 angstroms/minute. The abrasive sizes are, for example, 20 nm to 100 nm.

The polydisperse index is defined as follows.

A cumulative quantity analysis is, in reality, a polynomial of a logarithm complying with a G1 correlation function, as shown in the following.

$$Ln[G1]=a+bt+ct^2+dt^3+et^4+\ldots$$

The polydisperse index is defined as $2c/b^2$. Wherein, b is a second order cumulant or named as a z-average diffusion coefficient, and c is a coefficient of a square term. Calculation of the above parameter is clearly defined in ISO standard document 13321:1996E.

A content of the abrasives is 10 wt % to 40 wt %. According to another embodiment, the content of the abrasives is 15 wt % to 35 wt %. A material of the abrasives is, for example, a silicon dioxide, a metal oxide, a polymer material or hybrids of metal oxides and polymer materials. The silicon dioxide is, for example, fumed silica, colloidal silica, or silica sols. The colloidal silica may be obtained through hydrolysis of sodium silicate or potassium silicate or through hydrolysis and polycondensation of silanes. The metal oxide is, for example, precipitated alumina, fumed alumina, precipitated titania or fumed titania.

The content of the acid-base pH adjustor is 0.01 wt % to 10 wt %. According to another embodiment, the composition of the acid-base pH adjustor is 0.1 wt % to 5 wt %. The acid-base pH adjustor adjusts a pH value of the slurry composition to, for example, pH 9 to 12. According to another embodiment, the acid-base pH adjustor may adjust the pH value of the slurry composition to pH 10.5 to 11.5.

The acid-base pH adjustor is, for example, an acid, a base or a combination thereof. The acid is, for example, at least one of citric acid, oxalic acid, phosphoric acid, amino trimethyl phosphonic acid, 1-hydroxyethylidene-1,1-diphosphoric acid, 2-phosphonobutane-1,2,4-tricarboxylic acid, nitrilotrismethylenetriphosphonic acid, hexamethylene diamine tetra methylene phosphonic acid, diethylene triamine penta methylene phosphonic acid, hexamethylene triamine penta methylene phosphonic acid, malonic acid, lactic acid, acetic acid, propanic acid, butanoic acid, pentanoic acid, hexanoic acid, succinic acid, adipic acid, malic acid, maleic acid, tartaric acid, methane sulfonic acid, toluenesulfonic acid, dodecylbenzenesulfonic acid, ethylenediaminetetraacetic acid, diethylenetriaminepentaacetic acid, nitrilotriacetic acid, N-(hydroxyethyl)-ethylenediaminetriacetic acid and combinations thereof. The base is, for example, an inorganic base or organic base. The inorganic base is, for example, KOH or NaOH.

A composition of the oxidant is 0.01 wt % to 10 wt %. The oxidant is, for example, $H_2O_2$.

A remaining portion of the slurry composition is water. The water is, for example, deionized water.

In addition, the slurry composition may further include a complexing agent, so as to further enhance a speed of removing the film. When the slurry composition includes the complexing agent, the polishing selectivity ratio of the barrier material to the metal material is lowered to less than or equal to 1.2, and the polishing selectivity ratio of the dielectric material to the metal material is lowered to less than 2.

A content of the complexing agent is 10 ppm to 500 ppm. In addition, the content of the complexing agent may be 70 ppm to 500 ppm. According to another embodiment, the content of the complexing agent may be 70 ppm to 300 ppm.

The complexing agent is, for example, at least one of citric acid, oxalic acid, ammonium oxalate, tartaric acid, histidine, alanine and glycine.

As known from the above, in the slurry composition provided by the present invention, since the polydisperse index of the abrasives sizes is greater than 1.8, the speed of removing the film is enhanced.

In addition, when the slurry composition further includes the complexing agent, the speed of removing the film is further enhanced. Moreover, when the slurry composition includes the complexing agent, the polishing selectivity ratio of the barrier material to the metal material and the polishing selectivity ratio of the dielectric material to the metal material are lowered.

Figure 1B:
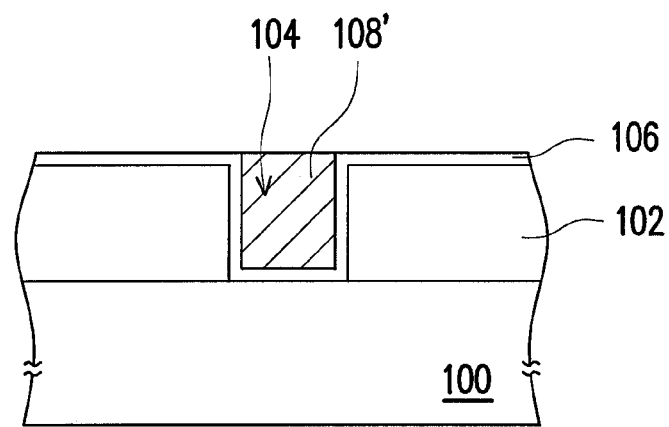
Figure 1C:
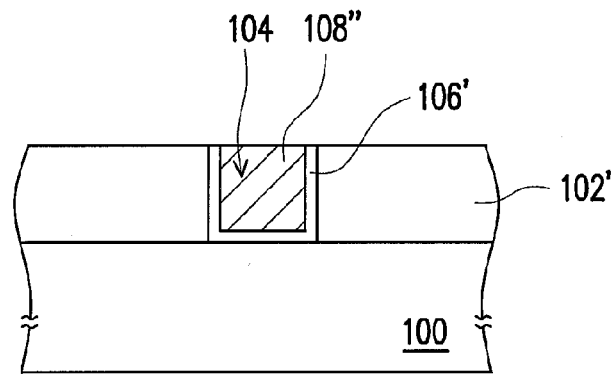

FIGS. 1A through 1C are schematic cross-sectional views showing the steps of fabricating a damascene structure according to an embodiment of the present invention.

First, a substrate 100 is provided, wherein a dielectric layer 102 has been formed on the substrate 100, and the dielectric layer 102 has an opening 104 which exposes the substrate 100. Electrodes (not shown) which are used to connect to a damascene structure have been formed in the substrate 100. A material of the dielectric layer 102 is, for example, silicon oxide, such as TEOS silicon oxide.

The opening 104 is, for example, a single damascene opening or a dual damascene opening. The single damascene opening is, for example, a contact opening, a via opening or a trench. The dual damascene opening is, for example, formed by the contact opening and the trench or by the via opening and the trench According to the present embodiment, the opening 104 is the single damascene opening as an example for illustration.

Next, a barrier layer 106 is conformally formed on the dielectric layer 102 and the substrate 100. A material of the barrier layer 106 is, for example, tantalum (Ta), tantalum nitride (TaN), tantalum/tantalum nitride (Ta/TaN), titanium (Ti), titanium nitride (TiN) or titanium/titanium nitride (Ti/TiN). A method of forming the barrier layer 106 includes, for example, a physical vapor deposition (PVD) method or a chemical vapor deposition (CVD) method.

Next, a metal layer 108 which fills the opening 104 is formed on the barrier layer 106. A material of the metal layer 108 is, for example, copper or tungsten. A method of forming the metal layer 108 is, for example, a PVD method.

Next, please refer to FIG. 1B. By using the barrier layer 106 is used as a polishing stop layer, a first CMP process is performed on the metal layer 108, so as to form a metal layer 108'.

Then, please refer to FIG. 1C, a second CMP process is performed, so as to remove the barrier layer 106 outside the opening 104. During the course of performing the second CMP process, a part of the dielectric layer 102, a part of the metal layer 108' and a part of the barrier layer 106 in the opening 104 are simultaneously removed, thereby forming the dielectric layer 102', the barrier layer 106' and the metal layer 108". The metal layer 108" is the damascene structure.

The slurry composition used in the second CMP process includes the abrasives, the acid-base pH adjustor, the oxidant and the water and may further include the complexing agent. The compositions, contents and functions of the slurry composition have already been described in detail in the previous embodiments, so that repeated descriptions are omitted here.

According to the above embodiment, since the slurry composition described above is used to perform the second CMP process, the barrier layer 106 outside the opening 104 is quickly removed, thereby increasing the yield of semiconductor devices.

In the following, actual tests are performed. A film structure of a test wafer is shown at that in FIG. 1B. According to the experimental embodiment, the second CMP process according to the embodiment described above is performed on the test wafer, so as to obtain the damascene structure as that in FIG. 1C. CMP machinery and settings thereof which are used are shown as following.

Model of CMP machinery: Applied Material Mirra 8"
Pad: Polytex (product name; manufactured by Rohm and Hass Electronic Materials)
Membrane pressure: 1.5 psi
Platen speed: 73 rpm
Head speed: 67 rpm
Inner tube pressure: 4 psi
Retaining ring: 4 psi
Slurry flow rate: 230 milliliters/minute Experimental Embodiment I The slurry composition is used to perform polishing on a barrier layer and a dielectric layer on the test wafer. According to experimental embodiment I, a barrier material which forms the barrier layer uses tantalum/tantalum nitride, and a dielectric material which forms the dielectric layer uses TEOS silicon oxide, and a metal material of the metal layer which is formed uses copper.

Compositions and ratios of the slurry composition according to experimental embodiment 1-1, experimental embodiment 1-2, comparative embodiment 1-1 and comparative embodiment 1-2 are shown in following Table 1. In Table 1, a polydisperse index of abrasive sizes of the abrasives 1 is 2, the abrasive sizes are 20 nm to 100 nm and an average of the abrasive sizes is 87 nm. A polydisperse index of abrasive sizes of the abrasives 2 is 1.02, the abrasive sizes are 20 nm to 130 nm and an average of the abrasive sizes is 80 nm. According to experimental embodiment 1-1, experimental embodiment 1-2, comparative embodiment 1-1 and comparative embodiment 1-2, the remaining portion of the slurry composition is water.

TABLE 1

|  | Abrasives | | Acid-base pH adjustor | | | |
|---|---|---|---|---|---|---|
|  | Abrasives 1 (%) | Abrasives 2 (%) | Methane sulfonic acid (%) | KOH (%) | Oxide $H_2O_2$ (%) | pH value |
| Experimental embodiment 1-1 | 20 | 0 | 0.15 | 0.12 | 1.00 | 10.59 |
| Experimental embodiment 1-2 | 20 | 0 | 0.15 | 0.24 | 1.00 | 11.4 |
| Comparative embodiment 1-1 | 0 | 20 | 0.15 | 0.12 | 1.00 | 10.5 |
| Comparative embodiment 1-2 | 0 | 20 | 0.15 | 0.24 | 1.00 | 11.33 |

Results of experimental embodiment I are shown in a following Table 2.

TABLE 2

|  | Removal rate of barrier material (angstroms/minute) | | Removal rate of dielectric material |
|---|---|---|---|
|  | Tantalum | Tantalum nitride | (angstroms/minute) TEOS silicon oxide |
| Experimental embodiment 1-1 | 772 | 980 | 1089 |
| Experimental embodiment 1-2 | 811 | 1011 | 1230 |
| Comparative embodiment 1-1 | 735 | 952 | 969 |
| Comparative embodiment 1-2 | 738 | 961 | 1082 |

Please refer to Table 2. Differences between experimental embodiment 1-1 and comparative embodiment 1-1 and between experimental embodiment 1-2 and comparative embodiment 1-2 are that the abrasives 1 having the higher polydisperse index of abrasive sizes are used in experimental embodiment 1-1 and experimental embodiment 1-2. As known from experimental results, the removal rates by the TEOS silicon oxide in experimental embodiment 1-1 and experimental embodiment 1-2 are both greater than 1000 angstroms/minute, whereas experimental embodiment 1-1 has the higher removal rate by the TEOS silicon oxide compared with comparative embodiment 1-1, and experimental embodiment 1-2 has the higher removal rate by the TEOS silicon oxide compared with comparative embodiment 1-2.

In addition, the content of KOH in experimental embodiment 1-2 is greater than the content of KOH in experimental embodiment 1-1, so that the pH value in experimental embodiment 1-2 is greater than the pH value in experimental embodiment 1-1. As known from experimental results, experimental embodiment 1-2 has the higher removal rates be the TEOS silicon oxide compared to experimental embodiment 1-1.

As known from experimental embodiment I, the slurry composition uses the abrasives having the higher polydisperse index of the abrasives size (greater than 1.8), thereby efficiently enhancing the removal rate of the dielectric mater (TEOS silicon oxide). In addition, appropriate enhancement of pH value of the slurry composition is beneficial to the removal rate of the dielectric material (TEOS silicon oxide).

Experimental Embodiment II

The slurry composition is used to perform polishing on the barrier layer and the dielectric layer on the test wafer. According to experimental embodiment II, the barrier material which forms the barrier layer uses tantalum/tantalum nitride, whereas the dielectric material which forms the dielectric layer uses TEOS silicon oxide, and a metal material which forms the metal layer uses copper.

Compositions and ratios of the slurry composition according to experimental embodiment 2-1 to experimental embodiment 2-2 and comparison embodiment 2-1 are shown in following Table 3. In Table 3, the polydisperse index of the abrasive sizes of the abrasives 1 is 2, the abrasive sizes are 20 nm to 100 nm and an average of the abrasive sizes is 87 nm. According to experimental embodiment 2-1 to experimental embodiment 2-2 and comparison embodiment 2-1, the remaining portion of the slurry composition is water.

TABLE 3

|  | Abrasives Abrasives 1 (%) | Acid-base pH adjustor | | Complexing agent Glycine (ppm) | Oxidant $H_2O_2$ (%) | pH value |
|---|---|---|---|---|---|---|
|  |  | Methane sulfonic acid (%) | KOH (%) |  |  |  |
| Comparative embodiment 2-1 | 20 | 0.15 | 0.24 | 0 | 1 | 11.38 |
| Experimental embodiment 2-1 | 20 | 0.15 | 0.24 | 40 | 1 | 11.38 |
| Experimental embodiment 2-2 | 20 | 0.15 | 0.24 | 70 | 1 | 11.38 |

Results of experimental embodiment II are shown in a following Table 4.

TABLE 4

| | Removal rate of metal material (angstroms/minute) | Removal rate of barrier material (angstroms/minute) | | Removal rate of dielectric material (angstroms/minute) | Selectivity ratio | | |
|---|---|---|---|---|---|---|---|
| | | | | | TEOS | | |
| | Copper | Tantalum | Tantalum nitride | TEOS silicon oxide | silicon oxide/Copper | Tantalum/Copper | Tantalum nitride/Copper |
| Comparative embodiment 2-1 | 385 | 563 | 654 | 923 | 2.40 | 1.46 | 1.70 |
| Experimental embodiment 2-1 | 650 | 732 | 975 | 1028 | 1.58 | 1.13 | 1.50 |
| Experimental embodiment 2-2 | 960 | 722 | 981 | 1183 | 1.23 | 0.75 | 1.02 |

Please refer to Table 4. Differences between experimental embodiment 2-1 to experimental embodiment 2-2 and comparative embodiment 2-1 are that the slurry compositions according to experimental embodiment 2-1 to experimental embodiment 2-2 have the complexing agent, whereas the comparative embodiment 2-1 does not have the complexing agent. As known from experimental results, compared with comparative embodiment 2-1, experimental embodiment 2-1 to experimental embodiment 2-2 which have the complexing agent in the slurry composition have lower polishing selectivity ratios of TEOS silicon oxide to copper and lower polishing selectivity ratios of tantalum, tantalum nitride to copper.

According to the experimental embodiment 2-1 and the experimental embodiment 2-2 which has the complexing agent, the selectivity ratios of TEOS silicon oxide to copper are less than 2. In addition, according to experimental embodiment 2-2 which has a content of the complexing agent equal to 70 ppm, the polishing selectivity ratio of tantalum, tantalum nitride to copper is less than 1.2.

As known from experimental embodiment 2-1 and experimental embodiment 2-2, increasing the content of the complexing agent in the slurry composition increases the removal rate to TEOS silicon oxide.

As known from experimental embodiment II, the slurry composition which has the complexing agent lowers the polishing selectivity ratio of the dielectric material (TEOS silicon oxide) to the metal material (copper) and lowers the polishing selectivity ratio of the barrier material (tantalum, tantalum nitride) to the metal material (copper). In addition, increasing the content of the complexing agent in the slurry composition increases the removal rate to the dielectrice material (TEOS silicon oxide).

Experimental Embodiment III

The slurry composition is used to perform polishing on the barrier layer and the dielectric layer on the test wafer. According to the experimental embodiment, a barrier material which forms the barrier layer uses tantalum nitride, and a dielectric material which forms the dielectric layer uses TEOS silicon oxide, and a metal material which forms the metal layer uses copper.

Compositions and ratios of the slurry composition used in experimental embodiment 3-1 to experimental embodiment 3-7 are shown in a following Table 5. In Table 5, the polydisperse index of the abrasive sizes of the abrasives 1 is 2, the abrasive sizes are 20 nm to 100 nm and the average of the abrasive sizes is 87 nm. According to experimental embodiment 3-1 to experimental embodiment 3-7, the remaining portion of the slurry composition is water.

TABLE 5

| | Abrasives Abrasives 1 (%) | Acid-base pH adjustor | | Complexing agent Alanine (ppm) | Oxidant $H_2O_2$ (%) | pH value |
|---|---|---|---|---|---|---|
| | | methane sulfonic acid (%) | KOH (%) | | | |
| Comparative embodiment 3-1 | 20 | 0.15 | 0.24 | 100 | 0 | 11.38 |
| Experimental embodiment 3-1 | 20 | 0.15 | 0.24 | 100 | 0.1 | 11.38 |
| Experimental embodiment 3-2 | 20 | 0.15 | 0.24 | 100 | 0.2 | 11.38 |
| Experimental embodiment 3-3 | 20 | 0.15 | 0.24 | 100 | 0.3 | 11.38 |
| Experimental embodiment 3-4 | 20 | 0.15 | 0.24 | 100 | 0.4 | 11.38 |
| Experimental embodiment 3-5 | 20 | 0.15 | 0.24 | 100 | 0.5 | 11.38 |
| Experimental embodiment 3-6 | 20 | 0.15 | 0.24 | 100 | 1 | 11.38 |
| Experimental embodiment 3-7 | 20 | 0.15 | 0.24 | 100 | 1.5 | 11.38 |

Results of experimental embodiment III are shown in a following Table 6.

TABLE 6

|  | Removal rate of metal material (angstroms/minute) Copper | Removal rate of barrier material (angstroms/minute) Tantalum nitride | Removal rate of dielectric material (angstroms/minute) TEOS silicon oxide | Selectivity ratio | |
| --- | --- | --- | --- | --- | --- |
|  |  |  |  | TEOS silicon oxide/Copper | Tantalum nitride/Copper |
| Comparative embodiment 3-1 | 845 | 672 | 1352 | 1.60 | 0.80 |
| Experimental embodiment 3-1 | 1088 | 863 | 1347 | 1.24 | 0.79 |
| Experimental embodiment 3-2 | 940 | 881 | 1347 | 1.43 | 0.94 |
| Experimental embodiment 3-3 | 892 | 904 | 1379 | 1.55 | 1.01 |
| Experimental embodiment 3-4 | 874 | 916 | 1380 | 1.58 | 1.05 |
| Experimental embodiment 3-5 | 838 | 929 | 1383 | 1.65 | 1.11 |
| Experimental embodiment 3-6 | 810 | 923 | 1305 | 1.61 | 1.14 |
| Experimental embodiment 3-7 | 788 | 943 | 1306 | 1.66 | 1.20 |

Figure 2:
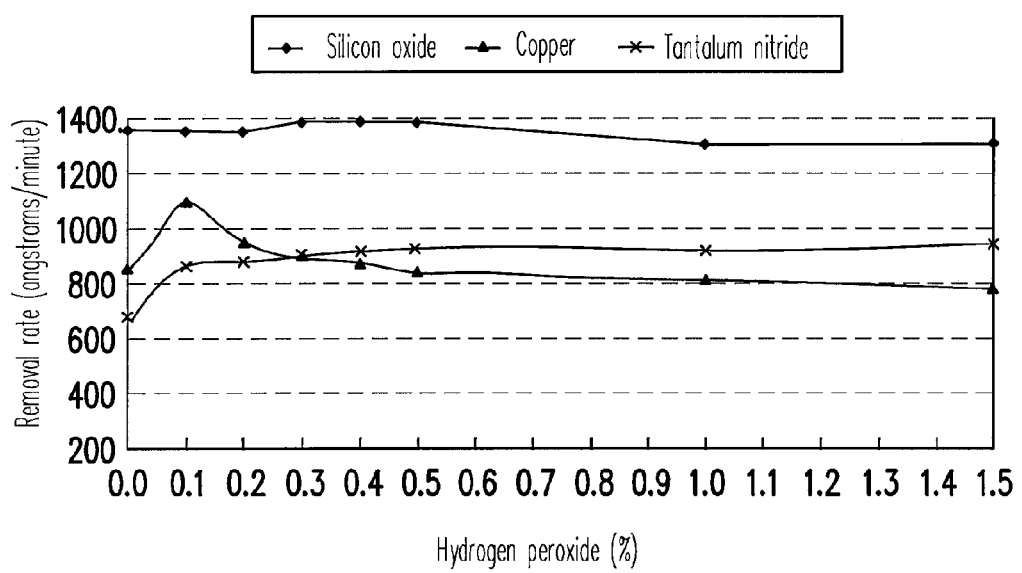
FIG. 2 is a relationship view showing contents of $H_2O_2$ and removal rates of a film according to the experimental embodiment III of the present invention.

FIG. 2 is a relationship view showing contents of $H_2O_2$ and removal rates of a film according to the experimental embodiment III of the present invention.

Please refer to both FIG. 2 and Table 6. As known from experimental embodiment 3-1 to experimental embodiment 3-7, when a concentration of $H_2O_2$ is 0.2% to 1.5%, the removal rate of the film is fairly stable.

As known from experimental embodiment III, the present invention may provide a wide operating range of the oxidant ($H_2O_2$), since when the concentration of $H_2O_2$ is 0.2% to 1.5%, the removal rates of the barrier material and the dielectric material are fairly stable.

Although the present invention has been described with reference to the above embodiments, it will be apparent to one of the ordinary skill in the art that modifications to the described embodiment may be made without departing from the spirit of the invention. Accordingly, the scope of the invention will be defined by the attached claims not by the above detailed descriptions.

What is claimed is:

1. A slurry composition, having an amount of 100% and comprising:
    abrasives, a content thereof being 10 wt % to 40 wt %, and a polydisperse index of abrasives sizes being greater than 1.8;
    an acid-base pH adjustor, a content thereof being 0.01 wt % to 10 wt %;
    an oxidant, a content thereof being 0.01 wt % to 10 wt %;
    a complexing agent capable of increasing a removal rate of a metal when using the slurry composition, a content thereof being 10 ppm to 500 ppm, wherein the complexing agent comprises at least one of citric acid, oxalic acid, ammonium oxalate, tartaric acid, alanine and glycine, and
    water, wherein a remaining portion of the slurry composition is said water.

2. The slurry composition of claim 1, wherein the content of the abrasives is 15 wt % to 35 wt %.

3. The slurry composition of claim 1, wherein a material of the abrasives is a silicon dioxide, a metal oxide, a polymer material or hybrids of metal oxides and polymer materials.

4. The slurry composition of claim 3, wherein the silicon dioxide comprises fumed silica or colloidal silica.

5. The slurry composition of claim 3, wherein the metal oxide comprises alumina or titania.

6. The slurry composition of claim 1, wherein the content of the acid-base pH adjustor is 0.1 wt % to 5 wt %.

7. The slurry composition of claim 1, wherein the acid-base pH adjustor comprises an acid, a base or a combination thereof.

8. The slurry composition of claim 7, wherein the acid comprises at least one of citric acid, oxalic acid, phosphoric acid, amino trimethyl phosphonic acid, 1-hydroxyethylidene-1,1-diphosphoric acid, 2-phosphonobutane-1,2,4-tricarboxylic acid, nitrilotrismethylenetriphosphonic acid, hexamethylene diamine tetra methylene phosphonic acid, diethylene triamine penta methylene phosphonic acid, hexamethylene triamine penta methylene phosphonic acid, malonic acid, lactic acid, acetic acid, propanic acid, butanoic acid, pentanoic acid, hexanoic acid, succinic acid, adipic acid, malic acid, maleic acid, tartaric acid, methane sulfonic acid, toluenesulfonic acid, dodecylbenzenesulfonic acid, ethylenediaminetetraacetic acid, diethylenetriaminepentaacetic acid, nitrilotriacetic acid, N-(hydroxyethyl)-ethylenediaminetriacetic acid and combinations thereof.

9. The slurry composition of claim 7, wherein the base comprises an inorganic base or organic base.

10. The slurry composition of claim 9, wherein the inorganic base comprises potassium hydroxide or sodium hydroxide.

11. The slurry composition of claim 1, wherein a pH value of the slurry composition is pH 9 to 12.

12. The slurry composition of claim 11, wherein the pH value of the slurry composition is pH 10.5 to 11.5.

13. The slurry composition of claim 1, wherein the oxidant comprises hydrogen peroxide.

14. The slurry composition of claim 1, wherein the water comprises deionized water.

15. The slurry composition of claim 1, wherein the content of the complexing agent is 70 ppm to 500 ppm.

16. The slurry composition of claim 15, wherein the content of the complexing agent is 70 ppm to 300 ppm.

17. The slurry composition of claim 15, wherein when using the slurry composition, a polishing selectivity ratio of a barrier material to a metal material is less than or equal to 1.2.

18. The slurry composition of claim 1, wherein when using the slurry composition, a polishing selectivity ratio of a dielectric material to a metal material is less than 2.

19. The slurry composition of claim 1, wherein a removal rate of the slurry composition to a dielectric material is greater than 1000 angstroms/minute.

20. The slurry composition of claim 1, wherein the content of the complexing agent is 40 ppm to 100 ppm.

21. The slurry composition of claim 1, wherein the complexing agent comprises at least one of oxalic acid, ammonium oxalate, tartaric acid, alanine and glycine.

22. The slurry composition of claim 1, wherein the complexing agent comprises alanine or glycine.

23. The slurry composition of claim 1, wherein the oxidant is $H_2O_2$, and a content thereof is 0.2 wt % to 1.5 wt %.

* * * * *